United States Patent [19]

Gale et al.

[11] 4,016,449
[45] Apr. 5, 1977

[54] LIGHT EMITTING DIODE DISPLAY

[75] Inventors: Geoffrey N. Gale, Aylmer; Edwin Denis Colbourne, Carp; Michael J. Hollins, Ottawa, all of Canada

[73] Assignee: Bowmar Canada Limited, Ottawa, Canada

[22] Filed: May 19, 1975

[21] Appl. No.: 578,600

[30] Foreign Application Priority Data

Feb. 28, 1975 Canada .............................. 221026

[52] U.S. Cl. ................................ 313/500; 313/510
[51] Int. Cl.² .................... A47B 88/00; A47B 95/00
[58] Field of Search ............ 313/500, 510; 357/17, 357/45

[56] References Cited

UNITED STATES PATENTS

| | | | |
|---|---|---|---|
| 3,354,342 | 11/1967 | Ohntrup et al. | 313/500 |
| 3,711,789 | 1/1973 | Dierschke | 313/500 X |
| 3,781,584 | 12/1973 | Kingsbury | 313/500 |

*Primary Examiner*—Stanley T. Krawczewicz
*Attorney, Agent, or Firm*—Wheeler, Morsell, House & Fuller

[57] ABSTRACT

This invention relates to a novel light emitting diode display of the type comprising a thin substrate, a plurality of light emitting diodes arranged along the substrate, and an electrical conductor pattern on the substrate which electrically interconnects the light emitting diodes so that all or selected ones may be made light emissive. The diodes are arranged along the thin or "thickness" edge of the substrate while the attendant electrical circuit pattern is carried on the side or sides of the substrate. This novel arrangement permits close packing of rows of light sources which heretofore was limited due to the fact that both the circuitry and diodes were carried on the same display face. Novel displays of this invention may also be used as character segments in alpha-numeric character displays.

5 Claims, 6 Drawing Figures

LIGHT EMITTING DIODE DISPLAY

FIELD OF INVENTION

This invention relates to a novel light emitting diode display of the type comprising a thin substrate, a plurality of light emitting diodes arranged along the substrate and an electrical conductor pattern on the substrate which electrically interconnects the light emitting diodes so that all or selected ones may be made light emissive in response to electrical impulse.

BACKGROUND OF THE INVENTION

A substrate used in a known display of the above description is formed from non-conductive material such as a circuit board, is relatively thin and has mounted on one substantially planar face thereof a plurality of spaced light emitting diodes (referred to hereinafter as LEDS) or groups of LEDS wherein the LEDS of each group are arranged in an alpha-numeric pattern. Where a number of alpha-numeric characters are to be displayed, for example nine digits, the width of the face of the substrate on which the LEDS are located, termed the "display face", is dictated in part by the amount of space required for the electrical conductor pattern. Additional displace face area is required when the cord is inserted into complementary card receiving and electrical contact means on the base to which the card is to be mounted. Due to the width of the display face of these known LED card displays, it was heretofore considered difficult to use display cards where close or dense packing of rows of alpha-numeric characters or rows of LED light sources was required. Indeed, even in single row character displays, the width of these known LED card displays has imposed certain design limitations due to the width of the display face.

SUMMARY OF THE INVENTION

The novel LED card display device of this invention is, as above noted, of the type comprising a thin substrate, a plurality of LEDS arranged along the substrate, and an electrical conductor pattern on the substrate which electrically interconnects the LEDS so that all or selected ones of the LEDS may be made light emissive. The improvement, however, resides in employing the thickness edge of the substrate, which may be conductive or non-conductive, as the display face by positioning the LEDS therealong. Inasmuch as the thickness edge of the substrate or card is thin, being typically in the order of 1/32 inch, 1/16 inch, or ⅛ inch, when employed as the display face, its effective display face width is significantly less than the width of the display faces of the previously known LED card displays. Thus in applications where rows of LED light sources or rows of alpha-numeric character displays are required in close proximity to each other, a plurality of the novel LED displays of this invention only need be arranged in parallel, as viewed from the display face, to thereby present a compact and dense arrangement of LED light sources. Accordingly, this invention also relates to a novel composite display of graphical information using LEDS, wherein the composite display is made up from a plurality of discrete displays of this invention.

We have also found that when employing the thickness edge of the substrate as the display face, discrete displays termed, "cards" may be used as individual alpha-numeric character segments. For example, seven cards having a display face width of say ⅛" and a display face length of approximately one inch or moare with 2 or more LEDS arranged therealong may be arranged in a FIG. 8 configuration by inserting each card in complimentary receiving and electrical contact recepticals provided in the base on which the cards are mounted. It will be apparent, however, that other connection techniques may be employed. Should a malfunction in the LEDS of a card forming a character segment occur, the segment card need only be removed from the base receptical and a replacement card substituted. A card display of this invention can also be used in other applications, such as, for example, as a bar graph in panel meters or the like, computer terminals or where strips or rows of lamps are required. Moreover, the novel display need not be limited to one or more rows of elongate displays since, by curving the thin substrate its display face edge can take any desired configuration, such as a circular or semi-circular display.

Although the display face of each LED display of this invention is thin relative to its depth, one or both of the sides of the substrate adjacent the length of the display face can advantageously carry the electrical conductor pattern. In order to facilitate easy card insertion in, and electrical contact with the base in which the display is to be mounted, the termination ends of the electrical conductor pattern remote from the LEDS can be for example, conveniently arranged along one edge of the substrate. By so positioning the electrical conductor pattern along one or both of the sides which depend from the display face, the width of the face required in known display cards is materially and advantageously reduced. Moreover, rows of the novel displays can be densely packed without having to devise suitable but complex electrical conductor patterns needed to electrically interconnect all of the closely packed LEDS as is presently the case. If desired, the depending sides of the substrate may also carry additional components, such as, for example an integrated circuit decoder/driver.

In order to provide improved light reflection, the "thickness" edge of the substrate is to be the display face, may itself be light reflective. Furthermore, the display face may be notched with each notch being light reflective so that emitted light from each LED positioned therein is reflected principally upwardly. In instances where light is to be diffused magnified, colour contrasted or merely where the display face is to be environmentally protected, the display face with its associated LED's may be covered over or encased within a lens as is known in the art. If futher magnification or deliniation of character segments is required, the novel display may also be combined with a light pipe having light reflectors extending therethrough as is also known in the art.

In accordance with a further embodiment of this invention, the substrate may be formed from a backing section of relatively stiff conductive or non-conductive material with an overlying layer of flexible circuitry film adhered thereto. The film, which carries all or a portion of the electrical connector pattern may itself be connected to LEDS positioned thereon prior to applying the film to the backing section. Alternatively, the LEDS can be mounted directly to the backing section with the film having "windows" or openings corresponding in location to the location of the LEDS on the backing section, applied thereover. The exposed LEDS are then electrically interconnected, such as by wire bonding, to the electrical connector pattern carried by the flexible circuitry film.

BRIEF DESCRIPTION OF THE DRAWINGS

In drawings which illustrate several embodiments of this invention.

DETAILED DESCRIPTION OF THE DRAWINGS

In the following description, the orientation of the light emitting diodes is such that the upper portions comprise the anodes while the bottom of the diodes is the cathode. It will be apparent to one skilled in the art that the orientation of the LEDS can be reversed. Similarly, while specific conductor patterns are set forth hereinbelow, it will be appreciated that many other arrangements are possible, such as for example using a substrate of electrically conductive material as a common anode or cathode conductor and electrically insulating therefrom the complimentary anode or cathode conductors, as the case may be.

Figure 1:
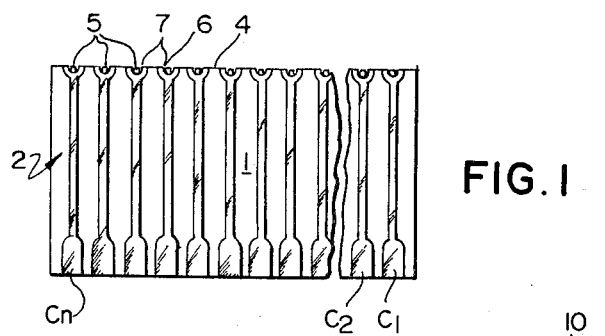
FIG. 1 is a side view of one side of the novel display as it may be used in bar-graph applications.
Figure 2:
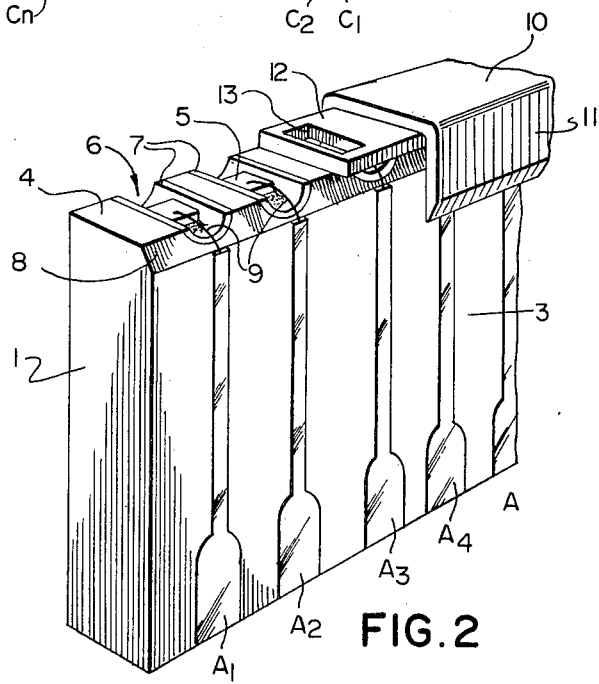
FIG. 2 is a partial schematic view of the display of FIG. 1, when viewed from one end and the other side to that of FIG. 1. Unlike FIG. 1, the display of FIG. 2 includes a light-pipe and lens cover which may be required in some applications.

With reference to FIGS. 1 and 2, substrate 1 is formed from suitble non-conductive material such as that used in conventional circuit boards. The "rear" side 2 of the substrate is provided with a plurality of cathode conductors $C_1, C_2 \ldots C_n$ which are arranged along this side. Anode conductors $A_1, A_2 \ldots$, etc. corresponding in number to the number of cathode conductors, are arranged on "front" side 3 of the substrate opposite corresponding ones of said cathode conductors. As will be seen, display face 4 is in fact one of the longitudinal thickness edges of the substrate.

While Leds 5 may be arranged along a flat display face 4, as shown, they are advantageously located in recesses or notches 6. Each notch is provided with a cathode reflector 7 which may be formed from the same material as that used for the anode and cathode conductors such as gold, silver, nickel or chromium. The cathode of each LED is electrically connected to corresponding ones of the cathode reflectors by being cemented thereto, using for example, silver or gold-filled epoxy. Moreover, each cathode reflector 7 is electrically connected to its corresponding cathode conductor $C_1$ to $C_n$. Light emitted from each LED positioned in a notch 6 is reflected upwardly by the cathode reflectors 7 to thereby increase the upward quantity of emitted light from the display face 4.

As seen in FIG. 2, anode conductors $A_1, A_2 \ldots A_n$ are terminated along level 8 and are connected to the upper anodes of the LEDS by wires 9.

The cathode and anode conductors terminate adjacent to the edge of the substrate opposed from display face 4. If a circuit is made, say between conductors $C_1$ and $A_1$, and energized, the associated LED 5 between conductors $C_1$ and $A_1$ will become light emissive.

As is known in the art, in order to diffuse or magnify the emitted light from each LED, in order to provide a colour contrast, or in order to protect the display environmentally, a clear or coloured lens cover 10 as illustrated in FIG. 2 may be positioned over display face 4 and secured by molding the lens in situ or, as shown, graspingly engaging sides 2 and 3 with side walls 11 of lens 10. Additionally, and as again shown in FIG. 2, the display may include a light pipe 12 having light reflectors 13 extending therethrough and overlying LEDS 5 which contribute to further magnification or character segment deliniation.

Figure 3:
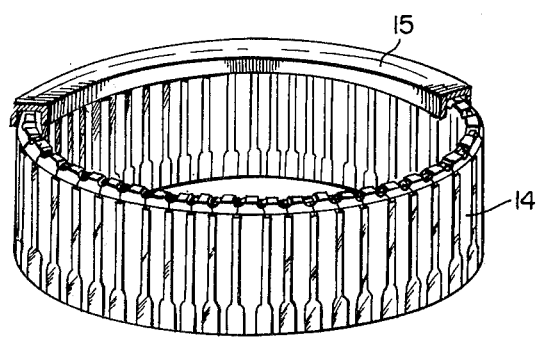
FIG. 3 is a schematic view of a curved bar-graph display of this invention, including a lens cover.

The curved bar graph display of FIG. 3, has application where other than straight displays of information may be required. The curved bar graph is constructed from a curved substrate 14 and has LEDS mounted along its thickness edge in the same or a similar fashion to the bar graph illustrated in FIGS. 1 and 2, and if desired may have an electrical conductor pattern arranged along the inner and outer sides the same as that described with reference to FIGS. 1 and 2. The display face of the substrate is covered over with curved lens 15 and if desired may further include a curved light pipe positioned between the display face of the substrate and the underside of the lens cover (not shown). By concentrically arranging curved bar graphs of different diameters, it is also possible to present a composite graphic display of several curved rows of light sources which are in close proximity to each other. Each curved row may visually transmit different and unrelated display information without the necessity of having a separate circular display instrument for each type of required information. Furthermore, the display colour of each row can be colour contrasted with the other row or rows by using different coloured lens covers.

Figure 4:
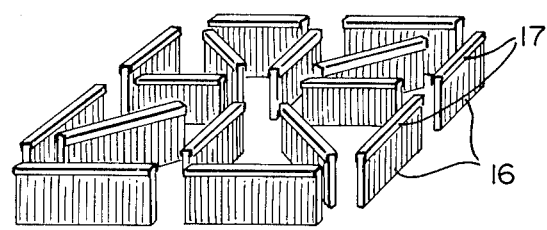
FIG. 4 is a schematic illustration of a sixteen segment alpha-numeric character employing sixteen card displays of this invention.

The alpha-numeric character illustrated in FIG. 4 comprises sixteen character segments, with each segment being identical and formed from a discrete display of this invention. Like the previously described displays, the LEDS are arranged along one thickness edge of each substrate 16 and if desired are covered by lens 17. As all of the LEDS associated with each discrete display, functioning as a character segment, are to become light emissive, common anode and cathode conductors may be employed (not shown). Should a malfunction occur in any one of the discrete displays, it need only be removed and replaced by a properly functioning display.

Figure 5:
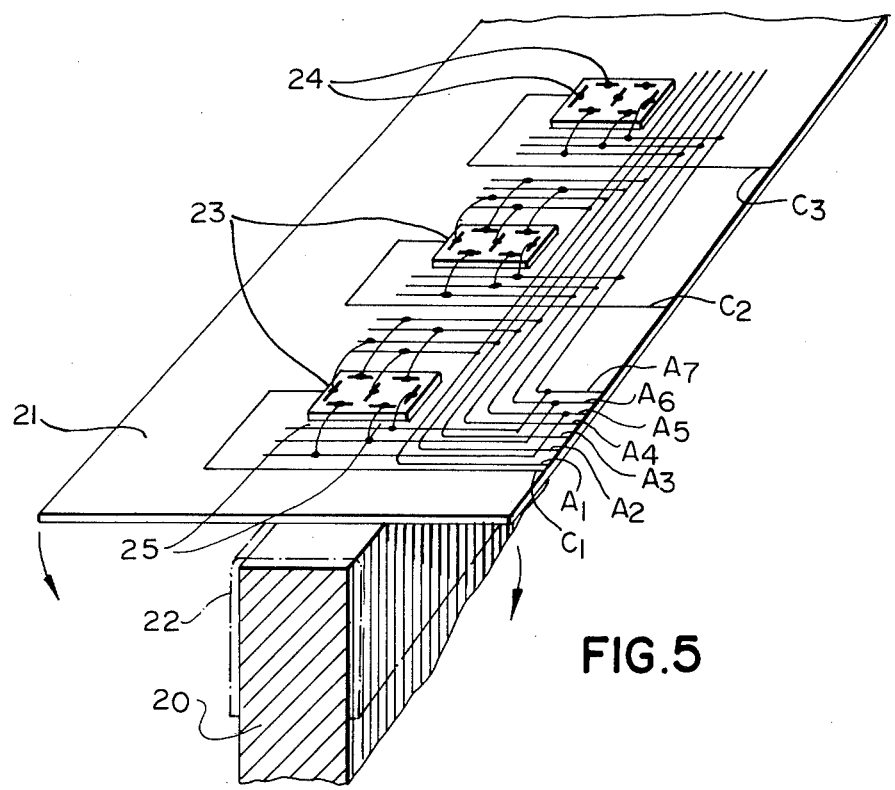
FIG. 5 is a schematic view of a display of this invention employing a substrate formed from a backing section and an overlying flexible circuitry film.
Figure 6:
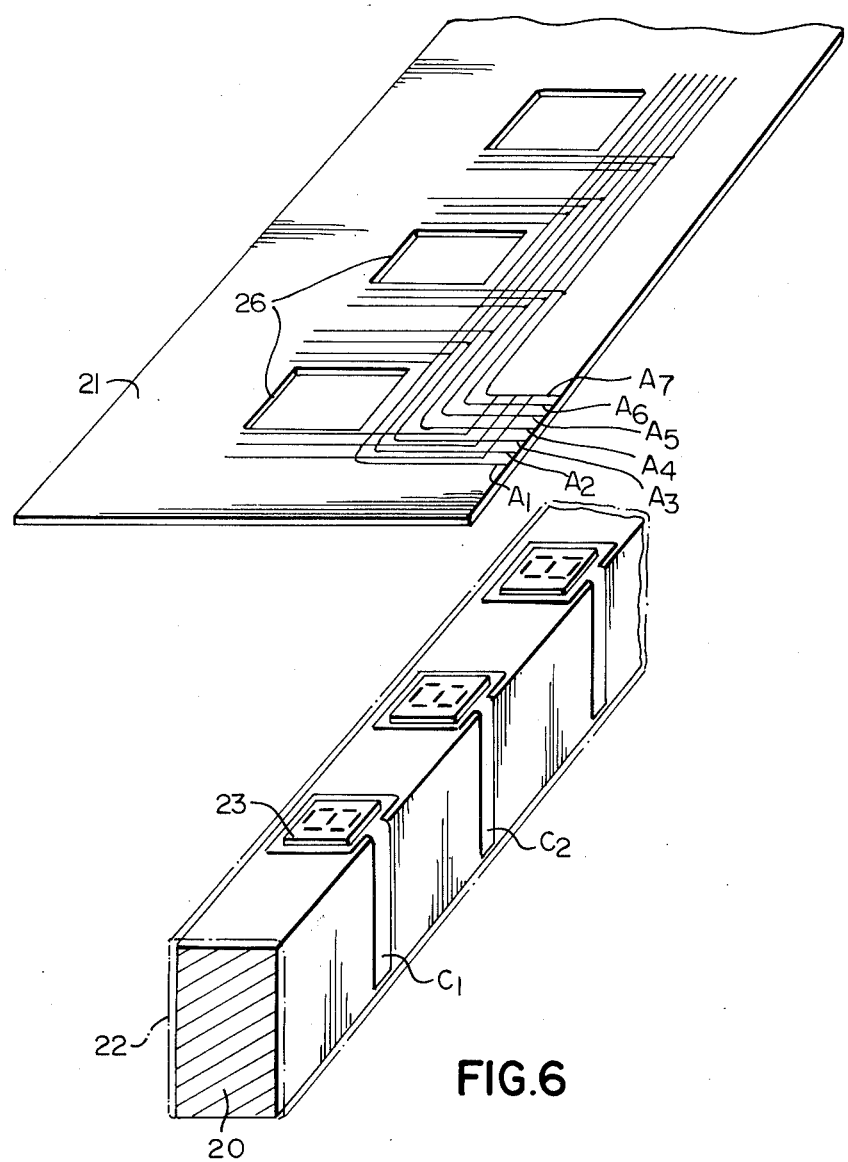
FIG. 6 is a view similar to that of FIG. 5 illustrating a further embodiment of the invention which employs "windowed" flexible circuitry film.

In the embodiments illustrated in FIGS. 5 and 6, the substrate is composed of a non-conductive backing section 20 and an overlying flexible circuitry film 21. For ease of understanding, film 20 is shown overlying the backing section prior to bending and affixing same over the backing section 20 as is indicated by broken lines 22. With reference to FIG. 5, film 21 is provided with a series of cathode conductors $C_1, C_2 \ldots C_n$ and anode conductors $A_1, A_2 \ldots A_7$. Centrally positioned along film 21 are a series of seven cathode plates 23 each one of which has electrically connected thereto seven LEDS 24 arranged in the FIG. 8 alpha-numeric configuration. Each of the cathode plates 23 is electrically connected to one of cathode conductors $C_1 - C_n$ whilst the anodes of each of LEDS 24 on a plate 23 is wire bonded by wires 25 to anode conductors $A_1 - A_7$ so that a character segment defined by one LED on a plate is electrically connected to the remaining and correspondingly positioned LEDS on the other plates 23.

In operation, as circuits between one or more of the anode connectors is made with one or more of the cathode connectors and is subject to electrical impulse, the LEDS in the energized circuit will become light emissive as is known in the art.

FIG. 6, like FIG. 5 employs a substrate utilizing backing section 20 and flexible circuitry film 21. Unlike the FIG. 5 embodiment, however, plates 23 are mounted directly to the thickness edge of backing section 20 with each plate 23 in turn being electrically interconnected with cathode conductors $C_1 - C_n$. Film 23 is provided with a plurality of windows 26 which correspond in number to the number of plates 23 mounted on the backing section and are of a size slightly larger than the size of the plates so that when the film is bent about the backing section, the windows effectively surround the plates. As the anode connectors $A_1 - A_7$ are carried by the film 21, once the film has been bent over the backing section and affixed thereto, the anode conductors, through the use of wires, are wire-bonded to the anodes of the LEDS.

Flexible circuitry film 21 which is essentially a laminate of non-conductive material with conductors sandwiched therebetween, has the conductors exposed at points adjacent to LEDS so that electrical connection can be effected. In a like manner, the conductors in the film are exposed at their termination ends remote from the display face in order to facilitate electrical contact with complimentary contact means on the base in which the substrate is inserted (not shown).

As noted above, the particular electrical conductor pattern employed in the display of this invention is not critical. For example, and with reference to FIGS. 1 and 2, substrate 1 could in fact be formed from a suitable conductive material and function as a common cathode for all of the LEDS arranged thereon. Provided anode $A_1 - A_n$ of FIG. 1 were suitably electrically insulated from the substrate cathode and electrically connected to the anodes of the LEDS arranged thereon, the resulting bar graph would produce the same desired result as achieved in the detailed description of FIGS. 1 and 2.

What we claim as our invention is:

1. A display device for displaying signals in response to an external electrical circuit to which it is connected, said device comprising a thin, relatively stiff substrate which has two opposed major faces which are normal to a display face defined by an elongate and substantially planar thin edge of the substrate, a plurality of light emitting diodes positioned in spaced relationship along said display face, an electrical cathode and anode conductor pattern on at least one of said major faces having first common ends terminating proximate said display face and second common ends terminating proximate a thin edge of the substrate other than said display face and wherein said first conductor ends are in electrical interconnection with said light emitting diodes so as to energize at least selected ones of said light emitting diodes in response to said external electrical circuit.

2. A display device as claimed in claim 1, wherein the display face is provided with a plurality of notches positioned therealong, each of said notches having a light reflective conductor surface coating which forms a portion of one of said anode and cathode conductors in said conductor pattern and which is electrically connected to the bottom surfaces of each light emitting diode positioned in each of said notches, the other of said anode and cathode conductors in said conductor pattern terminating at a beveled edge on said substrate intermediate said display face and one of said major faces and wherein the other of said conductors are electrically connected to the upper surfaces of each of said light emitting diodes.

3. A display device as claimed in claim 1, and further including a lens cover over said display face and which is connected to said major faces.

4. A display device as claimed in claim 1 wherein said substrate comprises a relatively stiff backing section which is covered over by a thin layer of flexible film which is adhered thereto and wherein at least one of said anode and cathode conductors in said conductor pattern is carried on said flexible film.

5. A composite display for displaying electrical signals by means of rows of light emitting diodes and in response to external electrical current to which said display is connected, wherein each of said rows in the composite display comprises a thin, relatively stiff substrate which has two opposed major surfaces which are normal to a display face which is defined by an elongate and substantially planar thin edge of the substrate, a plurality of light emitting diodes positioned in spaced relationship along said display face, an electrical cathode and anode conductor pattern on at least one of said major faces having first common conductor ends terminating proximate said display face and second common terminating ends proximate a thin edge of the substrate other than said display face and wherein said first common conductor ends are in electrical interconnection with said light emitting diodes so as to energize at least selected ones of said light emitting diodes in response to said external electrical current.

* * * * *